United States Patent
Mitani et al.

(10) Patent No.: US 9,933,494 B2
(45) Date of Patent: Apr. 3, 2018

(54) VOLTAGE DETECTION CIRCUIT

(71) Applicant: Seiko Instruments Inc., Chiba-shi, Chiba (JP)

(72) Inventors: Makoto Mitani, Chiba (JP); Kotaro Watanabe, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 292 days.

(21) Appl. No.: 14/656,163

(22) Filed: Mar. 12, 2015

(65) Prior Publication Data
US 2015/0260802 A1   Sep. 17, 2015

(30) Foreign Application Priority Data
Mar. 13, 2014   (JP) .................................. 2014-050434

(51) Int. Cl.
*G01R 31/40*   (2014.01)
*G01R 19/00*   (2006.01)

(52) U.S. Cl.
CPC .......... *G01R 31/40* (2013.01); *G01R 19/0084* (2013.01)

(58) Field of Classification Search
CPC ...... G01R 15/12; G01R 15/144; G01R 11/32; G01R 11/34; G01R 11/56; G01R 11/64; G01R 11/48; G01R 11/00
See application file for complete search history.

(56) References Cited

U.S. PATENT DOCUMENTS

| | | | | |
|---|---|---|---|---|
| 4,055,812 A * | 10/1977 | Rosenthal | ........... | H03F 3/45071 330/253 |
| 4,553,084 A * | 11/1985 | Wrathall | ................ | G01R 17/06 323/314 |
| 6,281,716 B1 | 8/2001 | Mihara | | |
| 6,975,162 B2 * | 12/2005 | Tamura | ..................... | G05F 1/56 323/312 |
| 7,274,916 B2 * | 9/2007 | Al-Shyoukh | ....... | H03F 3/45076 327/103 |
| 7,859,243 B2 * | 12/2010 | Lorenz | ..................... | G05F 3/26 323/313 |
| 2002/0079955 A1* | 6/2002 | Kang | ..................... | G05F 1/465 327/540 |

(Continued)

FOREIGN PATENT DOCUMENTS

| | | |
|---|---|---|
| JP | 6-21787 A | 1/1994 |
| JP | 2000-019200 A | 1/2000 |

*Primary Examiner* — Tung X Nguyen
*Assistant Examiner* — Dominic Hawkins
(74) *Attorney, Agent, or Firm* — Brinks Gilson & Lione

(57) ABSTRACT

To provide a voltage detection circuit in which the influence on a detection voltage by semiconductor manufacturing variations is small and which is small in current consumption. A voltage detection circuit is provided which detects a voltage, based on an output signal of a detection circuit and outputs a detection signal. The detection circuit includes a first MOS transistor unit which allows a first current to flow, a second MOS transistor unit which allows a second current to flow, and a current voltage conversion unit which converts each of the first current and the second current into a voltage and outputs the same as the detection signal. A voltage characteristic of the first current and a voltage characteristic of the second current are configured so as to be crossed with each other at a predetermined voltage.

9 Claims, 6 Drawing Sheets

(56) References Cited

U.S. PATENT DOCUMENTS

| | | | | |
|---|---|---|---|---|
| 2003/0218118 | A1* | 11/2003 | Kramer | H04N 3/155 |
| | | | | 250/214.1 |
| 2004/0252563 | A1* | 12/2004 | Hokuto | G11B 5/3906 |
| | | | | 365/200 |
| 2008/0012606 | A1* | 1/2008 | Fujita | G05F 3/242 |
| | | | | 327/103 |
| 2009/0243662 | A1* | 10/2009 | Aoike | H03F 3/45183 |
| | | | | 327/63 |
| 2011/0115530 | A1* | 5/2011 | Ohara | G05F 1/573 |
| | | | | 327/103 |
| 2011/0199360 | A1* | 8/2011 | Fujiwara | G09G 3/3688 |
| | | | | 345/211 |

* cited by examiner

VOLTAGE DETECTION CIRCUIT

RELATED APPLICATIONS

This application claims priority under 35 U.S.C. § 119 to Japanese Patent Application No. 2014-050434 filed on Mar. 13, 2014, the entire content of which is hereby incorporated by reference.

BACKGROUND OF THE INVENTION

Field of the Invention

The present invention relates to a voltage detection circuit, and more specifically to a reduction in the influence of manufacturing variations thereof.

Background Art

FIG. 7 is a circuit diagram illustrating one example of a related art voltage detection circuit.

NMOS transistors Q1 and Q2, NMOS transistors Q11 and Q12, and PMOS transistors Q3 and Q13 are respectively assumed to be the same size. A resistor R1 is made by, for example, a diffusion resistance or a gate POLY resistance. A voltage to be applied and a generated current indicate a proportional relation. A depletion type NMOS transistor R2 has a gate and a source connected to each other. When a drain-source voltage to be applied reaches a predetermined voltage or higher, the current becomes constant.

A current I1 which flows through the resistor R1 flows in the NMOS transistor Q2 as a drain current Is1 by a mirror circuit configured by the NMOS transistors Q1 and Q2. A current generated in the resistor R1 becomes small when a power supply voltage is small, and the current generated therein becomes large when the power supply voltage is large.

On the other hand, a current I2 which flows through a depletion type NMOS transistor R2 flows as a drain current Is2 of the PMOS transistor Q3 by mirror circuits respectively configured by the NMOS transistors Q11 and Q12 and the PMOS transistors Q3 and Q13. Since the depletion type NMOS transistor R2 hardly has drain voltage dependence in a saturation region, the drain current Is2 of the PMOS transistor Q3 does not change even when the power supply voltage changes.

The related art voltage detection circuit detects the power supply voltage using the relationship between the drain currents of the NMOS transistor Q2 and the PMOS transistor Q3 and the power supply voltage.

PATENT DOCUMENT 1

Japanese Patent Application Laid-Open No. Hei 6 (1994)-21787

SUMMARY OF THE INVENTION

In the voltage detection circuit, the resistor R1 is generally set to a few MΩ or so to lower its operating current. Generating such a large resistance value by the diffusion resistance or gate POLY resistance low in sheet resistance value will however result in an increase in chip area. Further, since the resistor R1 and the depletion type NMOS transistor R2 are manufactured independently in terms of a manufacturing process, they are affected by these manufacturing variations free of correlation and hence a variation in the detection voltage becomes large.

The present invention has been made in view of these problems and provides a voltage detection circuit which lowers an operating current while suppressing an increase in chip area and hardly causes the influence manufacturing variations.

There is provided a voltage detection circuit according to one aspect of the present invention, which detects a voltage, based on an output signal of a detection circuit and outputs a detection signal. The detection circuit includes a first MOS transistor unit which allows a first current to flow, a second MOS transistor unit which allows a second current to flow, and a current voltage conversion unit which converts each of the first current and the second current to a voltage and outputs the same as the detection signal. A voltage characteristic of the first current and a voltage characteristic of the second current are configured to be crossed with each other at a predetermined voltage.

The voltage detection circuit is provided which, even if an operating current is made low in consumption, suppresses an increase in chip area and suppresses the influence of manufacturing variations.

DESCRIPTION OF THE PREFERRED EMBODIMENTS

Figure 1:
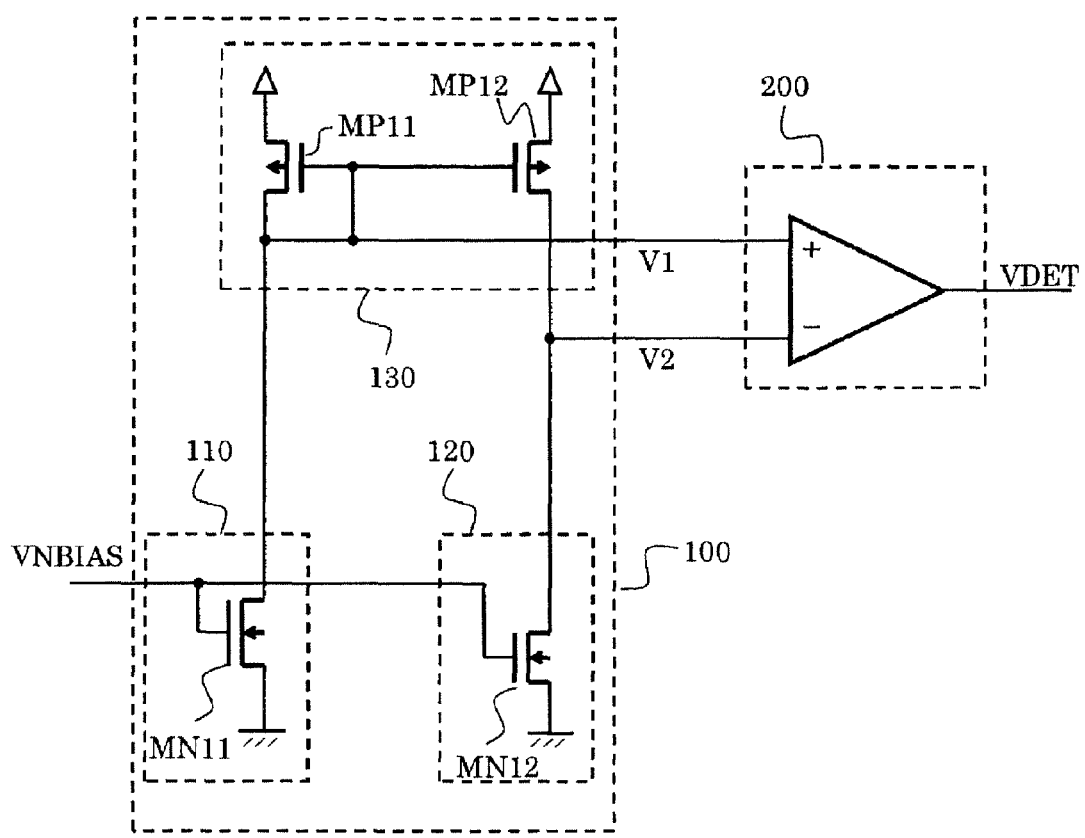
FIG. 1 is a circuit diagram illustrating a voltage detection circuit of a first embodiment.

A voltage detection circuit of the present invention is equipped with a detection circuit 100 and an output circuit 200.

The detection circuit 100 is equipped with a MOS transistor unit 110, a MOS transistor unit 120, and a current voltage conversion unit 130. The output circuit 200 is configured by, for example, a general comparator circuit.

Preferred embodiments of the present invention will hereinafter be described with reference to the accompanying drawings.

First Embodiment

FIG. 1 is a circuit diagram illustrating a voltage detection circuit of a first embodiment.

In the voltage detection circuit of the first embodiment, the MOS transistor unit 110 is comprised of an NMOS transistor MN11, and the MOS transistor unit 120 is comprised of an NMOS transistor MN12. A mirror ratio of a current mirror circuit is assumed to be 1:1 for purposes of illustration. Then, the NMOS transistor MN11 and the NMOS transistor MN12 have gates to which a suitable bias voltage VNBIAS is applied. Here, a gate length of the NMOS transistor MN11 is longer than a gate length of the NMOS transistor MN12, i.e., the NMOS transistor MN12 is set such that a channel length modulation effect becomes larger.

Since the same gate voltage is applied to the PMOS transistor MP11 and the PMOS transistor MP12, their Vd-Id curves are the same. Since the NMOS transistor MN11 is long in gate length, the channel length modulation effect is small and indicates a saturation drain current substantially constant relative to a drain voltage. Since the NMOS transistor MN12 is short in gate length, the channel length modulation effect is large and the saturation drain current increases linearly relative to the drain voltage.

Further, a gate width of the NMOS transistor MN11 is made wider than a gate width of the NMOS transistor MN12. By doing in this way, when the drain voltage is small in a saturation region, a drain current of the NMOS transistor MN11 becomes larger than that of the NMOS transistor MN12. Accordingly, the drain current of the NMOS transistor MN11 and the drain current of the NMOS transistor MN12 are reversed in magnitude at a predetermined power supply voltage VDD. That is, it is possible to set the power supply voltage VDD as a detection voltage.

Since the output circuit 200 is comprised of the general comparator circuit, the output circuit 200 outputs H and L levels according to the magnitudes of voltages V1 and V2. For example, when the voltage V1 is input to the plus side input terminal of the comparator circuit, and the voltage V2 is input to the minus side input terminal, an output voltage VDET becomes the L level at V1<V2 and becomes the H level at V1>V2.

The operation of the voltage detection circuit of the first embodiment will next be described.

Figure 2:
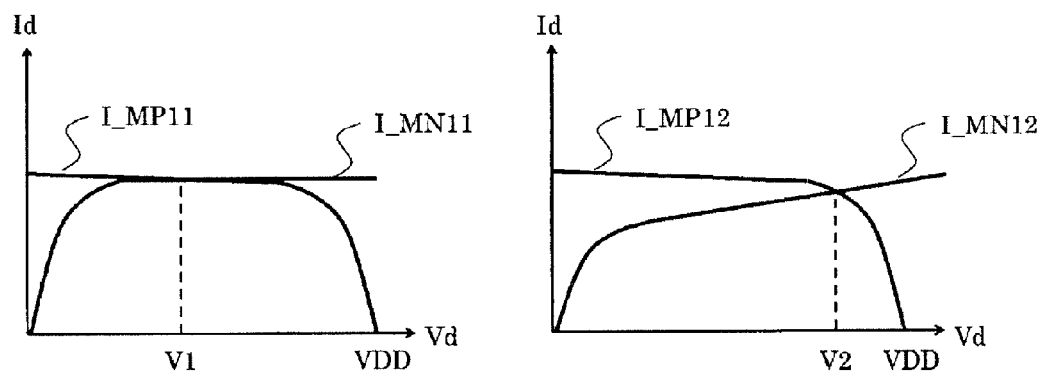
FIG. 2 is a diagram illustrating the relationship between the voltage and current of the voltage detection circuit of the first embodiment.
Figure 3:
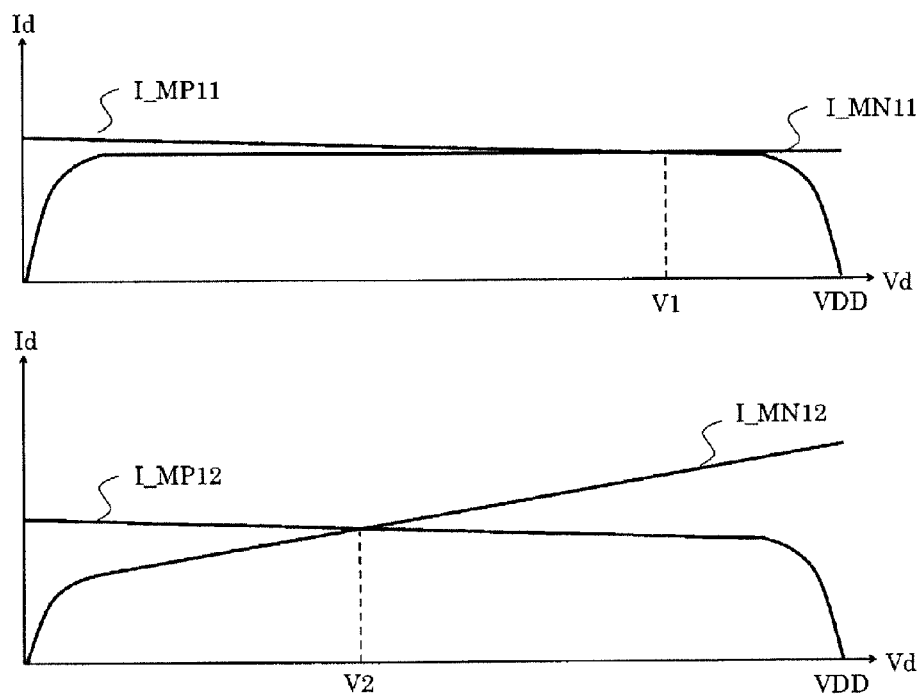
FIG. 3 is a diagram illustrating the relationship between the voltage and current of the voltage detection circuit of the first embodiment.

FIG. 2 illustrates a drain voltage (Vd)-drain current (Id) curve of each transistor when the power supply voltage VDD is small. Further, FIG. 3 illustrates a drain voltage (Vd)-drain current (Id) curve of each transistor when the power supply voltage VDD is large.

The power supply voltage (VDD) dependence of the voltages V1 and V2 will now be described. The voltage at a connection node between the NMOS transistor MN11 and the PMOS transistor MP11 is assumed to be V1, and the voltage at a connection node between the NMOS transistor MN12 and the PMOS transistor MP12 is assumed to be V2.

The PMOS transistor MP11 is saturation-connected and the NMOS transistor MN11 is small in channel length modulation effect even if the power supply voltage VDD is made large, the magnitude of |VDD−V1| indicates a substantially constant characteristic. Since the PMOS transistor MP12 is operated on a non-saturation basis when the power supply voltage VDD is small, the voltage V2 becomes small. When the power supply voltage VDD is large, the PMOS transistor MP12 enters a saturation region and the voltage V2 becomes a constant voltage even if the power supply voltage VDD changes.

From FIG. 2, the voltage V2 becomes larger than the voltage V1 when the power supply voltage VDD is small. This is because since the influence of the channel length modulation effect of the NMOS transistor MN12 is small, the drain current of the NMOS transistor MN12 becomes small so that V2 becomes large and the PMOS transistor MP12 is operated in a non-saturation region. At this time, the voltage detection circuit outputs an output signal VDET having an L level (power supply voltage non-detected state).

From FIG. 3, when the power supply voltage VDD is large, the voltage V2 becomes smaller than the voltage V1. This is because the influence of the channel length modulation effect of the NMOS transistor MN12 becomes large as the power supply voltage VDD becomes larger, and hence the drain current of the NMOS transistor MN12 becomes large, thereby making the voltage V2 small. At this time, the voltage detection circuit outputs an output signal VDET having an H level (power supply voltage detected state).

As described above, the voltage detection circuit of the present embodiment is capable of detecting the power supply voltage using the channel length modulation effect of the MOS transistor.

According to the voltage detection circuit of the present embodiment, since current consumption can be adjusted by adjusting the bias voltage of VNBIAS, it can be made low without an increase in chip area. Further, there is an effect that as to manufacturing variations in threshold voltage that are especially a problem, the influence thereof does not appear in the detection voltage because the elements for generating a comparison current are the same in structure. For example, if the threshold voltage of the NMOS transistor MN11 becomes large, the threshold voltage of the NMOS transistor MN12 having the same element structure becomes large. Thus, since the relative magnitude relationship between the drain currents of the NMOS transistor MN11 and the NMOS transistor MN12 does not change, the detection voltage is not affected by variations in the threshold voltage.

Incidentally, in the voltage detection circuit of the present embodiment, the difference has been provided between the gate widths to reverse the drain currents of the two NMOS transistors in magnitude at the predetermined power supply voltage VDD, but the difference may be provided between the threshold voltages of the NMOS transistors. That is, the threshold voltage of the NMOS transistor MN12 may be set to be larger than the threshold voltage of the NMOS transistor MN11.

Second Embodiment

Figure 4:
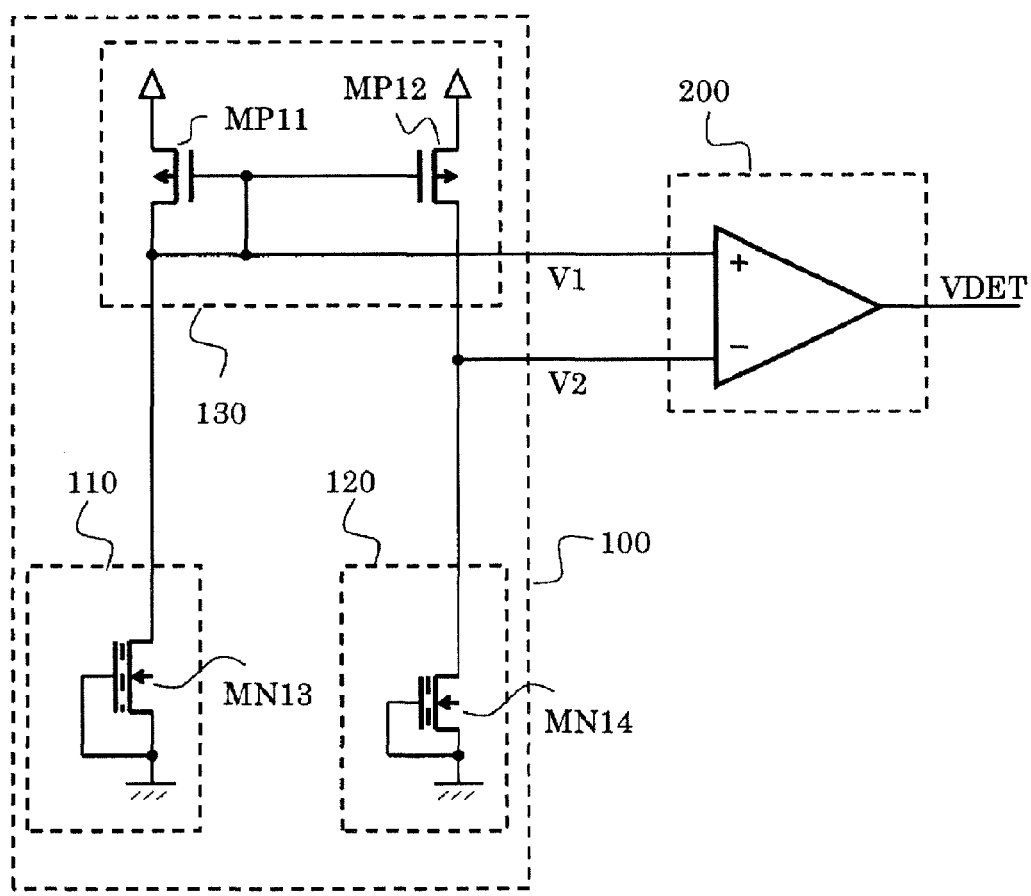
FIG. 4 is a circuit diagram illustrating a voltage detection circuit of a second embodiment.

FIG. 4 is a circuit diagram illustrating a voltage detection circuit of a second embodiment.

The same components as those in FIG. 1 are illustrated by the same reference numerals. A difference from FIG. 1 resides in that the MOS transistor unit 110 is configured by a depletion type NMOS transistor MN13, and the MOS transistor unit 120 is configured by a depletion type NMOS transistor MN14.

Here, the relation between the gate length and width of each transistor is similar to the voltage detection circuit of the first embodiment. By setting in this way, Vd-Id curves similar to FIG. 2 and FIG. 3 can be obtained, and the present voltage detection circuit is similar even in detecting operation to the voltage detection circuit of the first embodiment.

Since the MOS transistor units 110 and 120 are configured by the depletion type NMOS transistors in the voltage detection circuit of the second embodiment, no bias circuit is required and further the chip area can be reduced.

Third Embodiment

Figure 5:
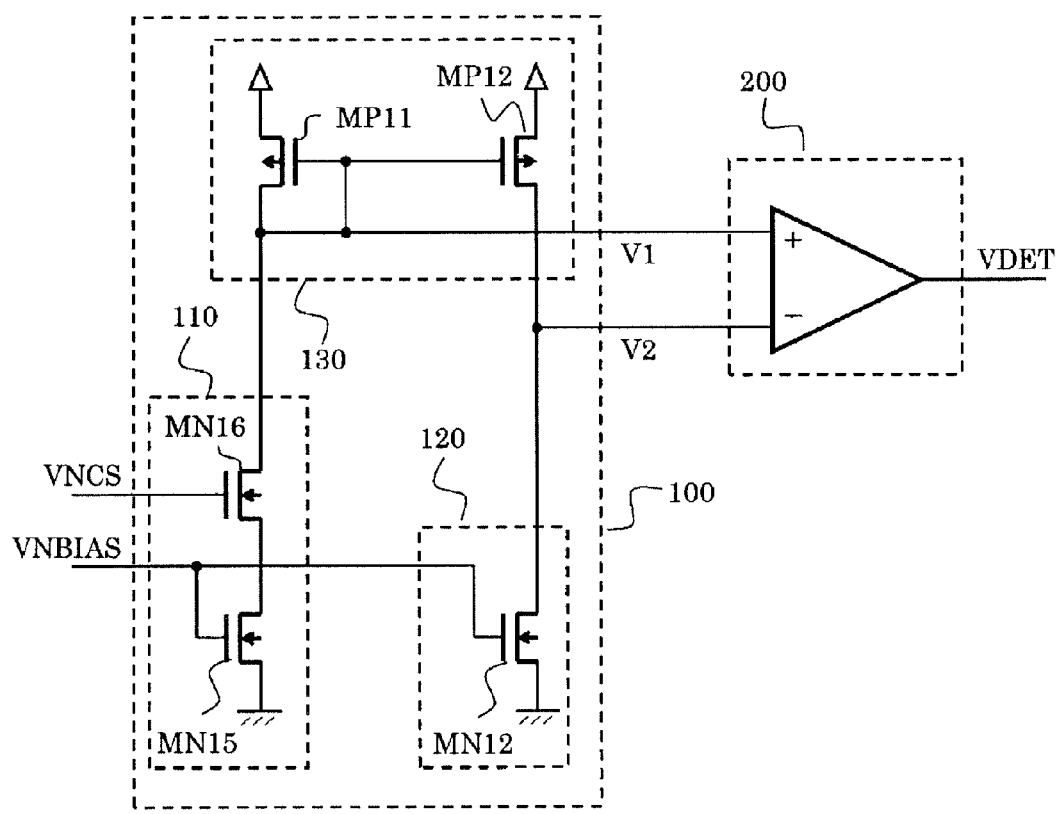
FIG. 5 is a circuit diagram illustrating a voltage detection circuit of a third embodiment.

FIG. 5 is a circuit diagram illustrating a voltage detection circuit of a third embodiment.

The same components as those in FIG. 1 are illustrated by the same reference numerals. A difference from FIG. 1 resides in that a cascode connection configuration of NMOS transistors MN15 and MN16 is provided as the MOS transistor unit 110. The NMOS transistor MN16 which serves as a cascode transistor, is supplied with a bias voltage VNCS suitable for its gate voltage.

In the voltage detection circuits of the first and second embodiments, the magnitudes of the channel length modulation effects of the MOS transistors in the MOS transistor units 110 and 120 have been achieved by providing the difference between the gate lengths. In the present embodiment, the magnitude of the channel length modulation effect is achieved by configuring the MOS transistor unit 110 side as the cascode connection of the NMOS transistors MN15 and MN16. Described more specifically, since the drain voltage of the NMOS transistor MN15 hardly changes by the cascode connection even if the power supply voltage VDD becomes large, the influence of the channel length modulation effect does not appear in the drain current. Since the NMOS transistor MN12 is not cascode-connected, the drain current becomes large due to the influence of the channel length modulation effect as the power supply voltage VDD becomes large. Further, the drain currents of the two NMOS transistors are set so as to be reversed in magnitude at a predetermined power supply voltage VDD by making the gate width of the NMOS transistor MN15 than that of the NMOS transistor MN12. With such a configuration, Vd-Id curves similar to FIG. 2 and FIG. 3 can be obtained.

Incidentally, in the voltage detection circuit of the present embodiment, the difference has been provided between the gate widths to reverse the drain currents of the two NMOS transistors in magnitude at the predetermined power supply voltage VDD, but the difference may be provided between the threshold voltages of the NMOS transistors. That is, the threshold voltage of the NMOS transistor MN12 may be set to be larger than that of the NMOS transistor MN15.

Further, the configuration of the cascode connection is not limited to the configuration of the present invention. The effect that it is hard for the drain voltage of the NMOS transistor MN15 to change relative to the power supply voltage VDD may be obtained. For example, the above can be achieved even by configuring MN16 by the depletion type NMOS transistor and connecting its gate voltage to VNBIAS. In this case, the bias circuit for generating the bias voltage VNCS becomes unnecessary.

Fourth Embodiment

Figure 6:
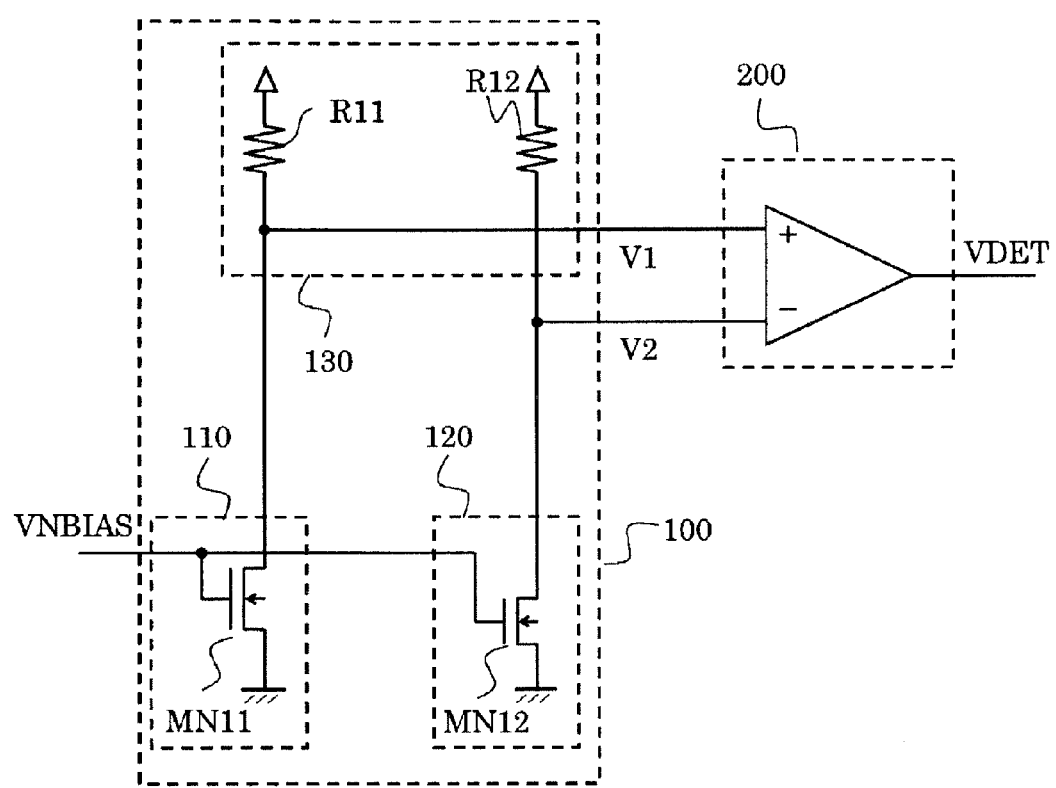
FIG. 6 is a circuit diagram illustrating a voltage detection circuit of a fourth embodiment.
Figure 7:
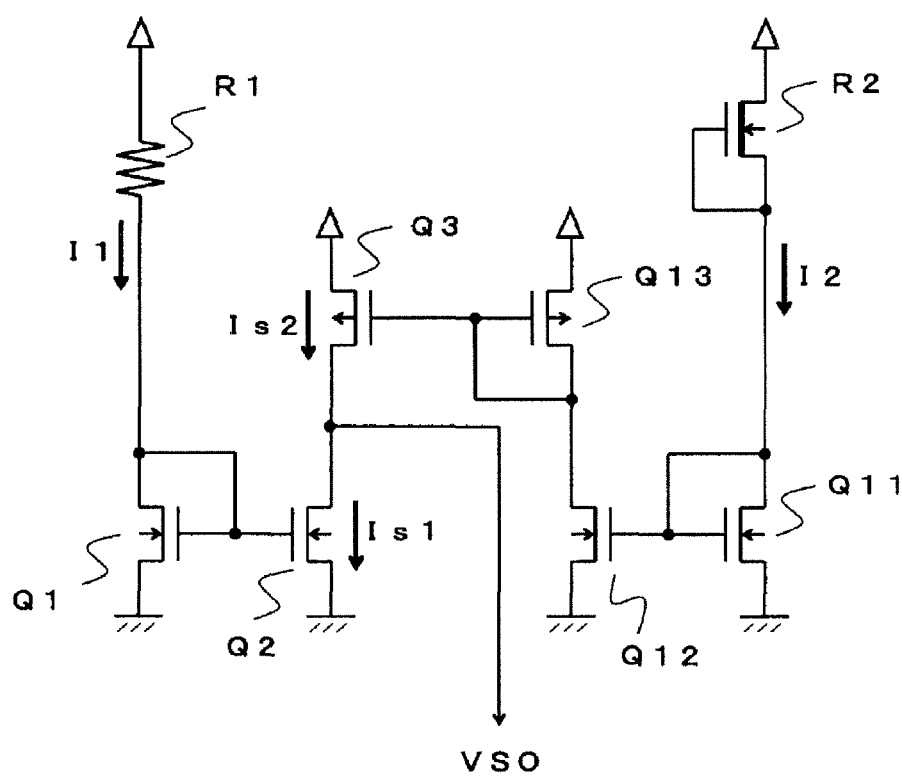
FIG. 7 is a diagram illustrating a related art voltage detection circuit.

FIG. 6 is a circuit diagram illustrating a voltage detection circuit of a fourth embodiment.

The same components as those in FIG. 1 are illustrated by the same reference numerals. A difference from FIG. 1 resides in that the current voltage conversion unit 130 is configured by resistors R11 and R12. A description will now be made about the case where the resistors R11 and R12 are respectively set to the same resistance value.

Drain voltage (Vd)-drain current (Id) curves of the NMOS transistor MN11 and the NMOS transistor MN12 are similar to those illustrated in FIG. 2 and FIG. 3. Thus, assuming that the current flowing through the resistor R11 is I_R11, the current flowing through the resistor R12 is I_R12, the voltage of a point of intersection between the current I_MN11 and the current I_R11 is V1, and the voltage of a point of intersection between the current I_MN12 and the current I_R12 is V2, a power supply voltage VDD can be detected by the voltages V1 and V2 as with the voltage detection circuit of the first embodiment.

According to the voltage detection circuit of the fourth embodiment, the resistor R11 and the resistor R12 are configured by the same element to thereby make it possible to prevent the influence of semiconductor manufacturing variations from appearing in a detection voltage. Further, current consumption can be reduced by suitably setting a bias voltage VNBIAS for the NMOS transistor MN11 and the NMOS transistor MN12 while the current voltage conversion unit 130 is configured by the resistors R11 and R12.

Incidentally, although the present embodiment has described that the NMOS transistor MN11 and the NMOS transistor MN12 have been set as with the first embodiment, the present embodiment can be realized even by combining the methods illustrated in the second and third embodiments. Further, although another configuration of the current voltage conversion unit 130 has been described using the resistors R11 and R12 in the present embodiment, it can be achieved if elements through each of which a current flows to generate a voltage are provided. For example, a constant current source may be used.

As described above, the voltage detection circuit of the present invention has the detection circuit 100 equipped with the MOS transistor unit 110, the MOS transistor unit 120, and the current voltage conversion unit 130, and the output circuit 200. Further, the voltage detection circuit is configured so as to detect the power supply voltage by setting drain voltage (Vd)-drain current (Id) curves of the MOS transistor unit 110 and the MOS transistor unit 120 so as to cross each other. This configuration makes it possible to provide the voltage detection circuit which, even if the operating current is made low in consumption, suppresses an increase in chip area and suppresses the influence of manufacturing variations.

Incidentally, the voltage detection circuit of the present invention has used the channel length modulation effects of the MOS transistors configuring the MOS transistor unit 110 and the MOS transistor unit 120, but is not limited to it if there are provided element characteristics in which the drain current becomes large as the power supply voltage VDD becomes higher. For example, a substrate current by the impact ionization of the MOS transistor may be used. To take an example, the NMOS transistor MN12 makes use of such an element that impact ionization is likely to occur as compared with the NMOS transistor MN11. That is, there are used transistors in which a low concentration region is provided in the drain of the NMOS transistor MN11 and not provided in the drain of the NMOS transistor MN12. Since the impact ionization does not occur in the NMOS transistor MN11, the saturation drain current is constant even if the drain voltage becomes large. Since the impact ionization occurs in the NMOS transistor MN12, the saturation drain current increases when the drain voltage exceeds a certain constant voltage value. Further, the power supply voltage VDD can be detected by adjusting the gate widths as with the first embodiment.

Further, the voltage detection circuit of the present invention may be configured such that the comparator circuit configuring the output circuit 200 is provided with an input offset. For example, at power on or the like, when the NMOS transistor MN11 and the NMOS transistor MN12 are non-saturation-operated when the power supply voltage VDD is low, the voltage V1 and the voltage V2 may be substantially equal to each other, thereby causing a possibility that the comparator circuit will perform misdetermination. By providing the input offset in the comparator circuit in such a case, the misdetermination can be prevented if the setting of the comparator circuit so as to be on the non-detection side when the voltage V1 and the voltage V2 are equal, etc. are performed. Further, an adjustment in the detection voltage is also possible by adjusting the input offset. It is possible to more suppress a variation in the detection voltage by providing the input offset with a trimming circuit, for example.

What is claimed is:

1. A voltage detection circuit comprising:
a detection circuit; and
an output circuit configured to detect a voltage, based on an output signal of the detection circuit and outputs a detection signal,
the detection circuit including:
a first MOS transistor unit configured to allow a first current to flow,
a second MOS transistor unit configured to allow a second current to flow, and
a single current voltage conversion unit connected to each of the first and second MOS transistor units by respective first and second connection lines and configured to covert each of the first current and the second current to a voltage and to output the voltage along the first and second connection lines to the output circuit as the detection signal,
wherein a voltage on the first current line and a voltage on the second current line are the same at a predetermined voltage, and
wherein the first MOS transistor unit is comprised of a first NMOS transistor, and the second MOS transistor unit is comprised of a second NMOS transistor, and
wherein the first NMOS transistor has a longer gate length and wider in gate width than the second NMOS transistor, such that a current difference exits due to a channel length modulation effect of each MOS transistor.

2. The voltage detection circuit according to claim 1, wherein the first MOS transistor unit further comprises a cascode transistor, and
wherein the first NMOS transistor has a wider gate width than the second NMOS transistor, such that a current difference exits due to a channel length modulation effect of each MOS transistor.

3. The voltage detection circuit according to claim 1, wherein the first current and the second current are provided between the first and second NMOS transistor and a current difference is generated by a substrate current impact ionization in each MOS transistor.

4. The voltage detection circuit according to claim 1, wherein the first NMOS transistor has a longer gate length and a smaller threshold voltage than the second NMOS transistor, such that a current difference exits due to a channel length modulation effect of each MOS transistor.

5. The voltage detection circuit according to claim 1, wherein the first NMOS transistor comprises a depletion type NMOS transistor, and the second NMOS transistor unit comprises a second depletion type NMOS transistor, and
wherein the first depletion type NMOS transistor has a longer gate length and a wider gate width than the second depletion type NMOS transistor, such that a current difference exists due to a channel length modulation effect of each MOS transistor.

6. The voltage detection circuit according to claim 1, wherein the current voltage conversion unit is comprised of a current mirror circuit.

7. The voltage detection circuit according to claim 1, wherein the current voltage conversion unit is comprised of resistive elements.

8. The voltage detection circuit according to claim 1, wherein the current voltage conversion unit is comprised of at least one constant current element.

9. The voltage detection circuit according to claim 1, wherein the output circuit is comprised of a comparator circuit equipped with an input offset.

* * * * *